(12) United States Patent
Furutani et al.

(10) Patent No.: US 9,355,705 B2
(45) Date of Patent: *May 31, 2016

(54) SEMICONDUCTOR DEVICE, METHOD FOR CONTROLLING THE SAME, AND SEMICONDUCTOR SYSTEM

(71) Applicant: PS4 Luxco S.a.r.l., Luxembourg (LU)

(72) Inventors: Kiyohiro Furutani, Tokyo (JP); Seiji Narui, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

This patent is subject to a terminal disclaimer.

(21) Appl. No.: 14/594,484

(22) Filed: Jan. 12, 2015

(65) Prior Publication Data

US 2015/0131389 A1    May 14, 2015

Related U.S. Application Data

(63) Continuation of application No. 13/886,323, filed on May 3, 2013, now Pat. No. 8,971,132, which is a continuation of application No. 12/697,728, filed on Feb. 1, 2010, now Pat. No. 8,462,560.

(30) Foreign Application Priority Data

Feb. 2, 2009    (JP) .................................. 2009-021995

(51) Int. Cl.
*G11C 11/406*    (2006.01)
*G11C 8/06*    (2006.01)
*G11C 8/12*    (2006.01)
*G11C 8/18*    (2006.01)

(52) U.S. Cl.
CPC ............ *G11C 11/40626* (2013.01); *G11C 8/06* (2013.01); *G11C 8/12* (2013.01); *G11C 8/18* (2013.01); *G11C 11/406* (2013.01); *G11C 11/40615* (2013.01); *G11C 2211/4061* (2013.01); *G11C 2211/4067* (2013.01)

(58) Field of Classification Search
None
See application file for complete search history.

(56) References Cited

U.S. PATENT DOCUMENTS

2006/0044910 A1*    3/2006    Chang .................. G11C 11/406
365/222

* cited by examiner

*Primary Examiner* — James G Norman

(57) ABSTRACT

The semiconductor device includes a temperature sensor controlled so that temperature measurement is made once at each of a plurality of different reference temperatures at an interval of a preset number of times of refresh operations and a plurality of latch circuits holding the results of temperature measurement. A refresh period is set from outputs of the latch circuits inclusive of the result of temperature measurement carried out last time for each of a plurality of different reference temperatures. After start of measurement, temperature measurements are repeated every wait time corresponding to circulation of the refresh operations. The refresh period is set such that the high-temperature side results of temperature measurement are prioritized (FIG. 2).

17 Claims, 10 Drawing Sheets

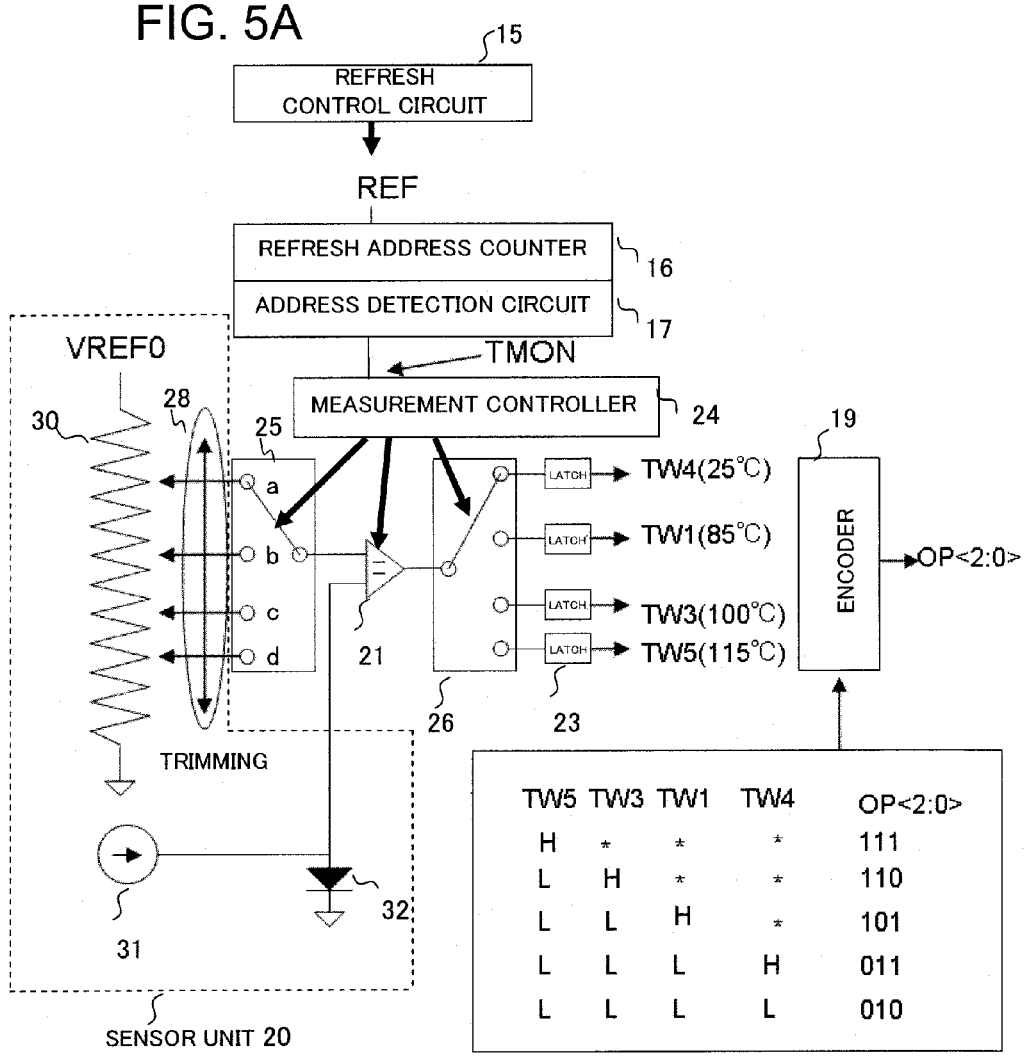

| | TEMPERATURE CODE OUTPUT | TW(25°C) | TW(85°C) | TW(100°C) | TW(115°C) |
|---|---|---|---|---|---|
| 25°C>T | 010 | L | L | L | L |
| 85°C>T>25°C | 011 | H | L | L | L |
| 100°C>T>85°C | 101 | L | H | L | L |
| | 101 | H | H | L | L |
| 115°C>T>100°C | 110 | L | L | H | L |
| | 110 | H | L | H | L |
| | 110 | L | H | H | L |
| | 110 | H | H | H | L |
| T>115°C | 111 | L | L | L | H |
| | 111 | H | L | L | H |
| | 111 | L | H | L | H |
| | 111 | H | H | L | H |
| | 111 | L | L | H | H |
| | 111 | H | L | H | H |
| | 111 | L | H | H | H |
| | 111 | H | H | H | H |

SEMICONDUCTOR DEVICE, METHOD FOR CONTROLLING THE SAME, AND SEMICONDUCTOR SYSTEM

CROSS REFERENCE TO RELATED APPLICATIONS

This application is a Continuation application of U.S. application Ser. No. 13/886,323 filed May 3, 2013, which is a Continuation of application Ser. No. 12/697,728 filed Feb. 1, 2010, which claims priority from Japanese Patent Application No. 2009-021995 filed Feb. 2, 2009, the disclosures of which are incorporated herein by reference in their entirety.

TECHNICAL FIELD

This invention relates to a semiconductor device. More particularly, it relates to a semiconductor device provided with a temperature measurement circuit, a method for controlling the semiconductor device, and to a semiconductor system comprising the semiconductor device and a controller controlling the device.

BACKGROUND

In a dynamic random access memory (DRAM) that stores the information by holding electric charge in a capacitor, a refresh operation is needed for data retention. In a DRAM, the refresh period needs to be made shorter at higher temperatures. Conversely, at lower temperatures, the data retention time is prolonged, and hence the refresh period may be made longer to reduce the current consumption of a DRAM. Such a configuration is therefore used in which the DRAM is provided with the function of outputting a temperature code indicating a current chip temperature and in which an apparatus that mounts the DRAM thereon causes a change in the period of issuance of a refresh command to the DRAM in dependence upon a temperature code output from the DRAM.

Patent Document 1 discloses a configuration as a technique related with a semiconductor device provided with a temperature measurement circuit. In this configuration, a first current (PTAT) whose current level rises with rise in temperature and a second current (CTAT) whose current level falls with rise in temperature are output by a temperature sensor to a comparator in response to a first current control signal (CTRLS1) or a second current control signal (CTRLS2). The comparator outputs a temperature signal (TS) having the information as to whether the temperature in the semiconductor device is higher or lower than a reference temperature. A holding unit saves the temperature signal from the comparator and subsequently outputs the so saved temperature signal to a controller. The controller then causes the current level of the first current (PTAT) or the second signal (CTAT) to be changed in response to the temperature signal (TS) output from the holding unit to generate the first current control signal (CTRLS1) or the second current control signal (CTRLS2) that control the reference temperature. The Patent Document 1 thus comprises a single temperature sensor/comparator, a holding unit comprises a plurality of latch circuits, and a plurality of switching circuits used to switch between the single temperature sensor/comparator circuit and a plurality of latch circuits. Outputs of a plurality of result latch circuits from LSB to MSB are combined together to yield a final result of temperature measurement with high accuracy.

Patent Document 2 discloses a configuration of controlling the self-refresh period in which the refresh period is adjusted in keeping with a change in temperature to reduce current consumption. In this configuration, temperature measurement is made at each maximum value time of a preset period to render the refresh period variable. Specifically, with Patent Document 2, a first period control signal (TS) is generated in response to a self-refresh start signal (SRS) or a self-refresh end signal (SRS). A sampling clock (SCLK) is generated in response to a clock signal (MSB) generated by the self-refresh start signal (SRS). A temperature sensor operates in response to the sampling clock (SCLK) to sense the temperature of the semiconductor memory device, and a corresponding second period control signal (TS) is generated. A period controller controls the self-refresh period in response to the first period control signal (TS) and the second period control signal (TS). The period controller decides the multiplication factor of the period clock signal (TCLK) applied from the clock generator in response to the period control signal (TS) to output the resulting signal as a refresh period signal (RS).

Patent Document 3 discloses a configuration of measuring the temperature in a semiconductor device in which a memory controller delivers a sampling clock to a memory device, which memory device measures the temperature in response thereto. The memory controller operates as an ODTS (On-Die Thermal Sensor) which is a temperature information output device that accurately updates the temperature information irrespectively of the DRAM's operating mode. Specifically, Patent Document 3 discloses a configuration comprising a temperature information code generation means and a flag signal logic decision means. The temperature information code generation means measures the temperature of the inside of the semiconductor device, in response to first and second enable signals, to generate a temperature information code having the information on the measured temperature. The flag signal logic decision means generates a plurality of first flag signals, having the temperature information, in response to the first and second enable signals, to decide whether the first flag signal has a preset logic level value or a variable logic level value.

[Patent Document 1] JP Patent Kokai JP-A-2005-031077
[Patent Document 2] JP Patent Kokai JP-A-2006-040527
[Patent Document 3] JP Patent Kokai JP-A-2008-083021

SUMMARY

The following analysis is made from the side of the present invention.

It is necessary that, even though the time of measurement has been made shorter by a simplified temperature measurement circuit and by a method for controlling the measurement, an optimum refresh period to cope with changes in temperature and a designing of the refresh period in safety are provided to retain the memory cell information. It is also necessary that the entire semiconductor system, carrying these functions, represents an efficient system. The following is an analysis of the related techniques by the present invention.

In the above mentioned Patent Documents 1 to 3, measurement of the in-chip temperature is carried out in connection with a self-refresh function (SRF function) and the result of measurement is reflected from time to time in changes in the preset time interval corresponding to the refresh period. In the self-refresh function, a plurality of memory cells connected to a given word line are refreshed at a preset time interval based on an internal timer owned by the memory device itself.

A memory controller issues an auto-refresh command (ARF) from time to time by an on-board timer, depending on the state of accessing from the CPU, during the time other than the accessing time from the CPU. It is up to the memory controller to comprehend changes in temperature in the inside of the memory device to change the ARF period in response to the temperature measured. In the auto-refresh (ARF), a command is issued to a memory device from outside the memory device, such as from a memory controller. The memory device then performs a refresh operation in response to this ARF command. The refresh operation is the operation of re-storing the charge in the multiple memory cells connected to the word line as selected by the refresh address.

In the configuration of Patent Document 3, wherein a memory device, in response to a sampling clock supplied from a memory controller, measures a temperature, much time is taken in temperature measurement. On the other hand, in case a system bus is shared by the memory controller and a plurality of memory devices, such as memory modules, exchanges of signals of temperature measurement at a given memory device (bus traffic) obstruct the communication between the memory controller and the other memory devices, thus deteriorating system bus throughput.

In Patent Document 1, a single temperature sensor/comparator circuit, a plurality of switches on the current side and another plurality of switches on the latch side are controlled for each temperature measurement to improve accuracy in measurement. However, the total measurement time and the accuracy in measurement are in a relationship of trade-off to each other.

In the Patent Documents 1 to 3, the refresh period is changed, that is, the timing of activating the word line being refreshed is changed, depending on the result of temperature measurement, at a time juncture when the refresh address counter has not as yet counted to its end, that is, circulation of the refresh operation of the word lines to be refreshed has not come to an end. There is thus a possibility that the refresh period of the memory cells, connected to the respective word lines, may become indefinite. The elapsed time information between the current refresh operation and the directly previous refresh operation may not be managed from one word line to another.

Patent Document 1 discloses a simplified configuration for a highly accurate temperature measurement, while Patent Documents 2 and 3 show a configuration of measuring the temperature at a preset time interval to change the refresh period. Even if the technical concepts disclosed in the Patent Documents 1 to 3 are combined together, the resulting technical concept is no more than the concept of performing highly accurate temperature measurement at a preset time interval.

To solve one or more of the above mentioned problems, the technical concept of the present invention may be substantially summarized as follows:

According to a representative technical concept of the present application, a single temperature measurement is carried out at a preset time interval for one of different reference temperatures as the basis for temperature measurement and decision. This temperature measurement is repeated to acquire a result of temperature measurement for each of the reference temperatures. These values of the measured results are used to set and change the refresh period. A simplified temperature measurement circuit is used and controlled to realize a shorter measurement time and yet an optimum refresh period may be obtained to cope with changes in temperature to retain the memory cell information.

According to another representative technical concept of the present application, the above mentioned preset time means a time interval that has at least a plurality of word lines to be refreshed, or its multiple(s), as one unit. This renders it unnecessary to manage the refresh period from one word line to another.

According to yet another representative technical concept of the present application, an encoder is used to set the refresh period. A plurality of measured results, obtained for different reference temperatures at an interval of a preset time, are entered to the encoder (logic circuit). The refresh period is set as the information (bit) of the measured result for the side of the higher measured reference temperature is prioritized. This means that control is performed preferentially towards a shorter memory cell refresh period, that is, towards a higher refresh frequency. By so doing, safe designing accompanying the setting of the refresh period may be achieved even by simplified formulation and condition for temperature measurement for retention of the memory cell information.

In addition, temperature measurement proceeds from the high temperature side towards the low temperature side, so that, even if the temperature is raised during circulation of temperature measurements carried out at a preset time interval, a measured result for higher temperature measured is processed (encoded) first without the necessity to wait for the end of circulation of the temperature measurements. The refresh period may be set promptly to a new value by such preferential processing by the encoder thus assuring re-storing the charge.

Moreover, since the measurement proceeds from the high temperature side towards the low temperature side, the measured result for the high temperature side is processed (encoded) preferentially even if the temperature is lowered during the time of circulation of temperature measurements at a preset time interval. Thus, if high temperature measurement has come to an end before the end of circulation of the temperature measurement, and the measured results are processed, the results on the high temperature side are prioritized at the time point of end of high temperature side measurement. The result is that the setting of the refresh period may be changed more promptly.

A semiconductor device according to the present invention comprises a temperature sensor, a measurement controller and a plurality of latch circuits. The measurement controller controls the temperature sensor so that a single temperature measurement will be performed once for each of a plurality of different reference temperatures for a preset number of times of refresh operations. The latch circuits hold the results of temperature measurement by the temperature sensor at each of the different reference temperatures. The outputs of the latch circuits are collectively processed to yield a result of temperature detection to set a refresh period.

A method for controlling a semiconductor device according to the present invention comprises controlling a temperature sensor so that temperature measurement is carried out once at each of a plurality of different reference temperatures for a preset number of times of refresh operations, holding results of temperature measurement by a plurality of latch circuits, and setting a refresh period from the totality of outputs of the latch circuits including the results of previous temperature measurements for respective different reference temperatures.

A semiconductor memory device according to the present invention comprises a temperature measurement circuit and an encoder. The temperature measurement circuit sequentially performs temperature measurement with respect to a plurality of different reference temperatures and retains the results of temperature measurement with respect to the respective different reference temperatures in a plurality of latch circuits. The encoder encodes outputs of the latch circuits and outputs the encoded signals as being the results of temperature detection.

Another semiconductor memory device according to the present invention comprises a resistor string, a comparator and a plurality of detectors. The resistor string outputs a voltage, divided from a reference voltage, at its tap. The comparator compares one of the tap voltages of the resistor string corresponding to the reference temperature with an output voltage of a temperature sensor element. The selectors receive the results of comparison by the comparator. The semiconductor memory device also comprises a circuit that sequentially selects the taps and the selectors in response to an input clock signal. The semiconductor memory device also comprises another circuit that receives signals from the selectors and that varies the period of the refresh clock signal depending on which temperature range determined by the respective different reference temperatures is currently valid. The refresh address counter performs its count operation by the refresh clock signal.

According to the present invention, there is provided a method for controlling a semiconductor memory device. The method comprises exercising control for performing temperature measurement by a temperature sensor for respective different reference temperatures for a preset number of times of refresh operations. The method also comprises holding measured results by the temperature sensor with respect to the respective different reference temperatures by a plurality of latch circuits. The method further comprises encoding outputs of the latch circuits and outputting the resulting encoded signals.

A memory system according to the present invention comprises a semiconductor device including a temperature sensor, a measurement controller, a plurality of latch circuits, a logic circuit and an output circuit. The measurement controller controls the temperature sensor so that a single temperature measurement will be performed once for each of a plurality of different reference temperatures for a preset number of times of refresh operations. The latch circuits hold a plurality of results of temperature measurement at the temperature sensor for a plurality of the different reference temperatures. The logic circuit collectively processes the information of the latch circuits to generate a signal representing the result of temperature detection. The output circuit outputs a temperature detection result signal to an external terminal. The memory system also comprises a memory controller including a read control circuit and a refresh period control circuit. The read control circuit reads out the temperature detection result signal. The refresh period control circuit adjusts the value of a preset time interval of issuing a refresh command to the semiconductor memory by the temperature detection result signal.

According to the present invention, an optimum refresh period to cope with changes in temperature and safe designing for the refresh period may be realized despite the use of a simplified temperature measurement circuit and a shorter measurement time achieved by a method for controlling the measurement. The memory cell information may thus be retained. In addition, according to the present invention, it becomes possible to prevent the throughput of the system bus from being lowered as a result of the temperature measurement of the semiconductor memory device.

Still other features and advantages of the present invention will become more readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTIONS OF THE DRAWINGS

FIG. 5A is a schematic view showing the configuration of a temperature measurement circuit according to the exemplary embodiment of the present invention.

FIG. 5B shows a corresponding truth table.

PREFERRED MODES

Figure 2:
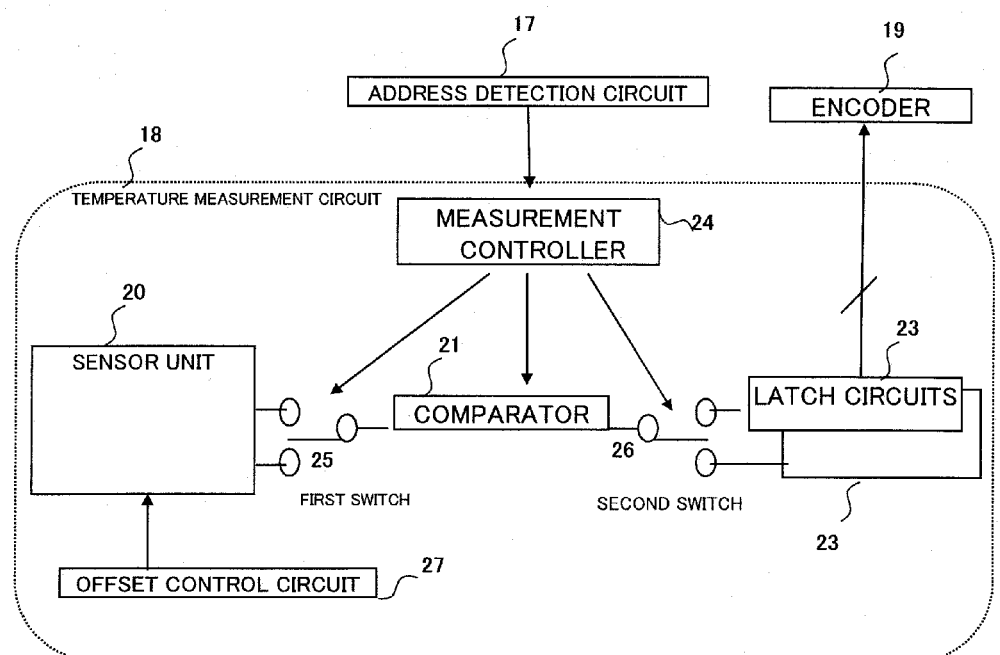
FIG. 2 is a block diagram showing a configuration of a temperature measurement circuit according to the exemplary embodiment of the present invention.

Exemplary embodiments of the present invention will be described in the below. Referring to FIG. 2, a semiconductor memory device according to the exemplary embodiment includes a temperature measurement circuit (18). In this temperature measurement circuit (18), a temperature controller (24) sequentially selects, in a first switch (25), a reference value associated with each of a plurality of respective different reference temperatures. The reference voltages with respect to the respective different reference temperatures are sequentially compared by a comparator (21) with an output voltage of a temperature sensor device (diode). The respective results of comparison, sequentially compared by the comparator (21), are held by relevant ones of latch circuits (23) via the second switch (26). An encoder (19) is an example of the logic circuit and continuously encodes outputs of the latch circuits (23) during the temperature measurement to output the resulting encoded signal as a temperature detection result to outside via an output terminal of the semiconductor memory device. Or, the encoder outputs the encoded signal for self-refresh to a refresh control circuit in order for the semiconductor memory device itself to decide on the refresh period.

The temperature measurement circuit (18) operates once each time the refresh address counter (16) has counted to its end, that is, once each circulation of the refresh operations of the totality of the word lines connected to the memory cells to be refreshed has come to an end. The comparator (21) may thus compare the voltage at the temperature sensor element (diode) with the values of the reference voltages for the preset reference temperatures to hold the results of the comparison at the comparator (21) in the latch circuits (23) associated with the preset reference temperatures.

Based on the result of detection of the end of the circulation of the refresh addresses by the address detection circuit (17), the measurement controller (24) of the temperature measurement circuit (18) controls the change-over of the first switch (25) and that of the second switch (26). The first switch selects the reference values for a plurality of reference temperatures of a subject for detection, while the second switch selects the connection between the output of the comparator (21) and the latch circuits.

The measurement controller (24) controls the first switch (25) and the second switch (26) in synchronization with each other.

Each time circulation of the refresh operation for the word lines to be refreshed has come to an end, temperature detection by the comparator (21) and holding of the result of comparison of the comparator (21) in the relevant latch circuit (23) are carried out in the temperature measurement circuit (18). The time interval in which circulation of the change-over operations of the first and second switches (25, 26) comes to an end is (time interval of the circulation of the word lines being refreshed, that is, a preset number of word lines)× (number of latch circuits).

The measurement controller (24) changes over the first and second switches (25, 26) for each measurement operation by the temperature measurement circuit (18) that is carried out for each circulation of the refresh operation for the word lines being refreshed. The temperature measurement is thus carried out for each of a plurality of temperature measurement conditions. The temperature measurement conditions are switched in response to the end of the circulation of the refresh operation of the set of the word lines to be refreshed. In the comparator (21), the in-chip temperature, that is, the temperature of a silicon substrate which is sensed by a temperature sensor element (diode), is compared with each of a plurality of respective different reference temperatures.

The encoder (19) encodes the information held by the latch circuits (23) as the information on the high temperature side is prioritized. The encoder includes an output circuit that outputs the encoded information to an external terminal.

In the memory device according to the present invention, the encoded signal from the encoder (19) that receives outputs from the latch circuits (23) is output, in response to a request issued to the memory device from e.g., a memory controller (or a like device) that controls the memory device.

The memory controller includes a means for receiving the output encoded signal from the memory device and a means for changing the refresh period (ARF period) for the memory device based on the temperature information derived from the encoded signal. It is to be noted that the memory controller may include a plurality of means for changing the refresh (ARF) periods and is able to control different refresh (ARF) periods for the temperature information output from a plurality of memory devices.

The temperature measurement at the preset reference temperatures, such as 25° C., 85° C., 100° C. and 115° C., is carried out once each time the circulation of the refresh operation for the word lines being refreshed has come to an end, as described above. This single temperature measurement may be carried out by a temperature measurement circuit of the memory device for each circulation of the refresh operation for the word lines by the memory device by an ARF (auto-refresh command) supplied from the memory controller.

Alternatively, the memory device may perform refresh by an SRF command supplied from the memory controller. In this case, the above mentioned single temperature measurement may be executed by the temperature measurement circuit of the memory device each time the circulation of the refresh addresses has come to an end.

According to the present invention, in which the refresh period is controlled in response to the result of temperature measurement performed for each circulation of the refresh addresses, it is unnecessary to manage the refresh time on the word line basis.

The refresh address counter in a memory device that generates refresh addresses is not reset on the occasion of transition from the ARF (auto-refresh) to the SRF (self-refresh) or vice versa. The refresh address counter is not reset except for the case of resetting on power up and for the case where a reset command for forced resetting is given from the memory controller. According to the present invention, it is possible to improve the accuracy in temperature measurement and to shorten the measurement time. That is, according to the present invention, the count operation for the number of times equal to the number of word lines to be refreshed as a unit is continued, and hence the management of temperature measurement may be maintained.

According to a technical concept of the present invention, there may be provided a plurality of temperature sensors 20 and a plurality of comparators 21 in association with a plurality of different reference temperatures. In this case, the first and second switches 25 and 26 may both be dispensed with. The measurement controller 24 selects and controls the plurality of temperature sensors 20 and the plurality of comparators 21. In this case, results of temperature measurement, measured at reference temperatures being different for a preset number of times of the refresh operations, may be obtained in a plurality of latch circuits 20. There may be provided such a configuration including a temperature sensor 20, a plurality of comparators 21, and the first switch 25 between the temperature sensor 20 and comparators 21. Exemplary Embodiments of the present invention will now be described.

Exemplary Embodiment 1

Figure 1:
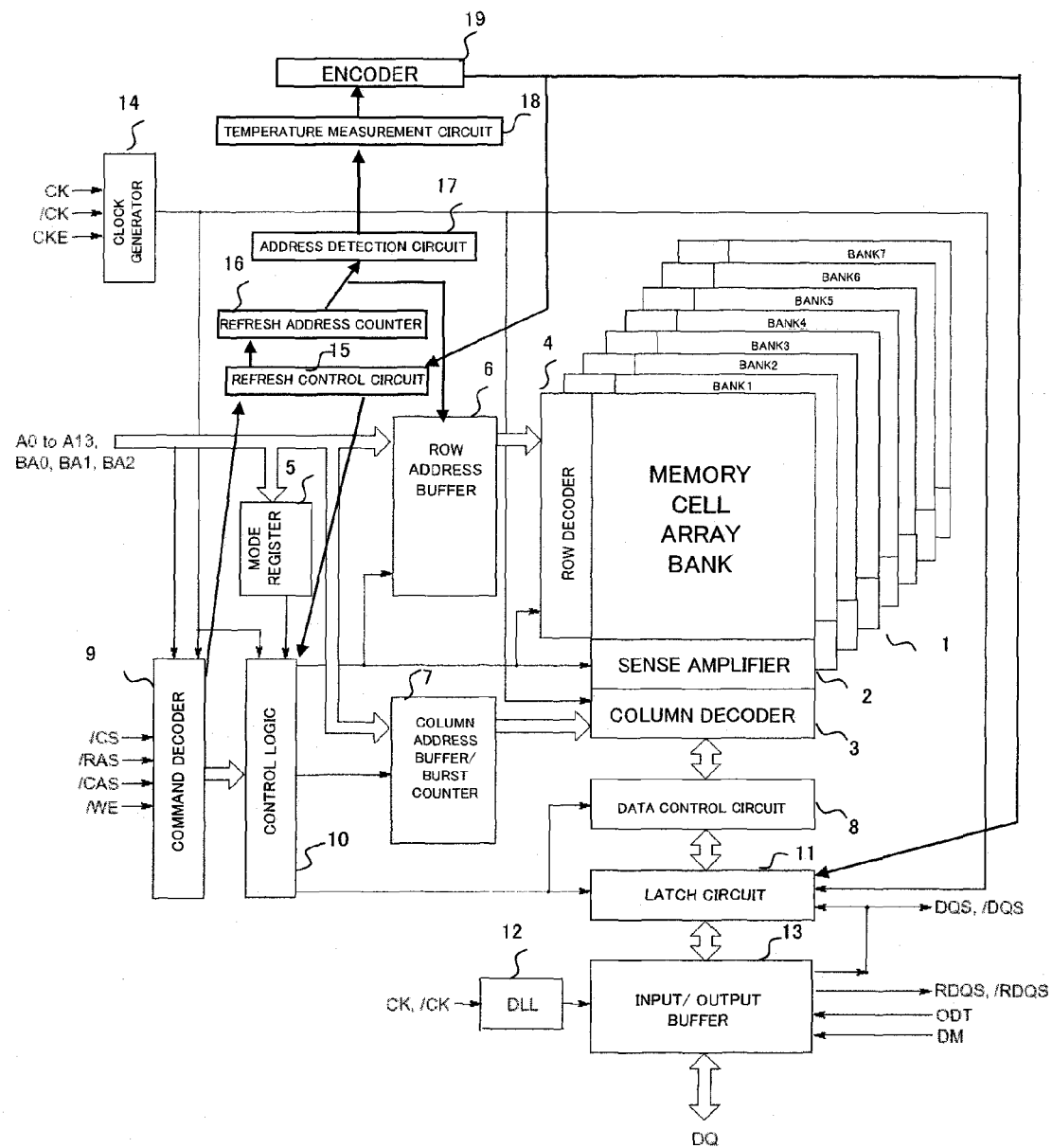
FIG. 1 is a block diagram showing the overall arrangement of a memory device of an exemplary embodiment of the present invention.

FIG. 1 shows an arrangement of the inside of a DRAM device according to a first Exemplary Embodiment of the present invention. The DRAM device of FIG. 1 is a DDR (Double Data Rate) SDRAM (Synchronous DRAM) of an eight-bank structure, only in a non-limiting way. The DDR means that data is to be exchanged in synchronism with both rising and falling edges of a clock signal. Referring to FIG. 1, a row decoder 4 decodes a row address to drive a selected word line, not shown. A sense amplifier 2 amplifies data read out on a bit line, not shown, of a memory cell array 1. During the refresh operation, the sense amplifier amplifies cell data read out on a bit line connecting to a cell of the word line as selected by a refresh address, and writes back the so amplified cell data to the cell. A column decoder 3 decodes a column address to turn on a Y-switch, not shown, to select a bit line to connect it to an I/O line, also not shown. A command decoder 9 receives a preset address signal and, as control signals, a chip select signal /CS, a row address strobe signal /RAS, a column address strobe signal /CAS and a write enable signal /WE to decode the command. A slash/preceding a signal name indicates a LOW active signal. A column address buffer/burst counter 7 generates, under control of a control logic 10 that receives a control signal from the command decoder 9, a number of addresses of a burst length from the input column addresses, and sends the so generated addresses to the column decoder 3. A mode register 5 receives the address signals and bank selection signals BA0, BA1 and BA2 to output a control signal to the control logic 10. Each bank selection signal selects one of the eight memory banks. Meanwhile, the DRAM device of FIG. 1 includes, in addition to the mode register 5, a plurality of extended mode registers, such as EMR1 and EMR2, not shown, used for setting the functions that may not be set by the mode register. The memory banks each include an area which is used as a unit for memory access and which includes a preset number of memory cells. Each memory bank has a function of allowing for independent access such that the memory banks can be controlled non-exclusively. A number of blocks, described later, each include an area as a unit for memory access which includes a preset number of memory cells in a given bank. The blocks are controlled non-exclusively.

If the command decoder 9 has recognized (decoded) the refresh command, it notifies a refresh control circuit 15 of that effect. In response thereto, the refresh control circuit 15 outputs a signal that initiates a count operation by a refresh address counter 16. The command decoder 9 recognizes an auto refresh (ARF) command or a self-refresh (SRF) command from a memory controller, not shown, to activate the refresh control circuit 15.

The refresh control circuit 15 is responsive to the ARF command, received from outside, such as from the memory controller, to send out an address count-up signal to the refresh address counter 16. The refresh control circuit 15 is also responsive to the SRF command received to enter into a self refresh mode (SR entry). The refresh control circuit 15 is responsive to a timer value of an internal timer, not shown, provided in the refresh control circuit 15, to send out an address count-up signal to the refresh address counter 16.

The refresh control circuit 15 also sends out a refresh request signal to the control logic 10.

During the self-refresh operation, the refresh control circuit 15 also changes the refresh period in accordance with an encode signal OP received from an encoder 19 as later described. For example, the refresh control circuit controls an oscillator, not shown, generating the refresh period, and a frequency multiplication circuit, also not shown, to change the refresh period (refresh frequency). The frequency multiplication circuit divides the frequency of the oscillator output. The frequency multiplication circuit 46 has its activation/deactivation controlled by a signal ATCSR (Automatic Temperature Compensated Self Refresh) as set by EMR (Extended Mode Register) 2 (A6), though this is not to be construed restrictively.

The memory cell array 1 is accessed by the refresh address from the refresh address counter 16 and a control signal from the control logic 10. A plurality of memory cells connecting to a word line selected by the row decoder 4 that receives the refresh addresses are refreshed.

On detection of the end of circulation of the count operation by the refresh address counter 16, an address detection circuit 17 outputs a signal that activates a temperature measurement circuit 18, i.e. a signal that enables an operation of temperature measurement.

The encoder 19 encodes a measured result of the temperature measurement circuit 18 (a number of bit signals latched by a plurality of latch circuits).

The refresh address counter 16 receives the refresh signal from the refresh control circuit 15 to perform a count-up operation, and outputs a count output as a refresh address. A count-down operation may also be performed in place of the count-up operation.

A row address buffer 6 inputs, in its multiplexer, not shown, a row address from an address terminal and a refresh address (a bit string from the LSB to the MSB of a counter output) from the refresh address counter 16. The row address buffer selects the refresh address during the refresh operation, while selecting the row address from the address terminal otherwise. The row address buffer sends the so selected address to the row decoder 4.

The clock generator 14 receives complementary external clocks CK, /CK supplied to the DRAM device. When the clock enable signal CKE is HIGH, the clock generator 14 outputs an internal clock. If once the clock enable signal CKE becomes LOW, subsequent delivery of the internal clock ceases.

A data control circuit 8 inputs/outputs write data and read data. A latch circuit 11 inputs/outputs the write data and the read data. The latch circuit 11 also latches the encoded result from the encoder 19. At this time, an output of the data control circuit 8 connected to an input of the latch circuit 11 (an output circuit of read data) is turned off.

An input/output buffer 13 inputs/outputs data at a data input/output terminal DQ. The input/output buffer 13 outputs the encoded result from the encoder 19 in parallel at the data terminal DQ. It is to be noted that the latency used in a read operation is preferably applied in connection with outputting of the encoded signal, which is the result of the encoding, in response to a request from the memory controller. The reason for this is that system bus management in a memory system is simplified. In the above, the read operation is a normal operation of accessing data from the memory cell array 1 and the latency denotes the number of the external clocks CK and /CK as from a command input until a data output.

A DLL (Delay Locked Loop) 12 generates a signal, delay-synchronized with respect to the external clocks CK and /CK, to supply the so generated signal to the input/output buffer 13.

Read data from the memory cell array 1 is supplied from the latch circuit 11 to the input/output buffer 13. This input/output buffer 13 outputs the Read data from the input/output terminal DQ at a double data rate, using rise and fall edges of the clock signal synchronized by the DLL 12 with the external clock CK.

Among the control signals, entered to the input/output buffer 13, DM is a data mask signal for write data. Data is written during write when the data mask signal DM is HIGH. DQS and /DQS are differential data strobe signals that prescribe the data write/read timing, and are I/O signals that become an input signal and an output signal for write and read operations, respectively. TDQS and /TDQS are differential changeover signals to render the x8 data configuration compatible with the x4 data configuration. ODT (On Die Termination) is a control signal that turns the terminal resistor of DQ, DQS, /DQS, TDQS and /TDQS on or off. Meanwhile, there is schematically shown in FIG. 1 a typical example of the DRAM device and, of course, the present invention is not to be restricted to this illustrative configuration.

FIG. 2 shows an internal arrangement of the temperature measurement circuit 18 and an example connection configuration between it on one hand and the address detection circuit 17 and the encoder 19 on the other hand. Referring to FIG. 2, the temperature measurement circuit 18 of the present exemplary embodiment includes a sensor unit 20, a voltage comparator 21, a plurality of latch circuits 23, a first switch 25, a second switch 26, a measurement controller 24, and an offset control circuit 27. The first switch 25 switches between the sensor unit 20, specifically, a plurality of taps of a resistor string within the sensor unit, and an input (reference voltage terminal) of the voltage comparator 21. The second switch 26 switches between the outputs of the comparator 21 and a plurality of inputs of the latch circuits 23. The measurement controller 24 controls the operation of the voltage comparator 21 and the switching of the first and second switches 25 and 26. The offset control circuit 27 controls the offset of the sensor unit 20.

Based on the output of the address detection circuit 17, that is, the result of detection that the refresh address counter has counted to its end, the measurement controller 24 performs operation control of the voltage comparator 21 and switching control of the first and second switches 25 and 26.

The address detection circuit 17 detects the end of circulation of the refresh addresses, and outputs the result of go-around end detection to the measurement controller 24.

In the present exemplary embodiment, the voltage comparator 21 is activated by the measurement controller 24 once each circulation of the refresh addresses. On the other hand, the counterparts of connection of the first and second switches 25 and 26 are switched, under control by the measurement controller 24, for each circulation of the refresh addresses. That is, the first and second switches 25 and 26 are switched, under a command by the measurement controller 24, in such a manner that a preset temperature measurement for one of a plurality of temperature measurement conditions will be carried out once. That is, the temperature measurement conditions are switched in dependence upon the number of times of circulation of the refresh addresses.

In the temperature measurement circuit 18, the temperature is detected against one of the different reference temperatures at the voltage comparator 21 for each circulation of the word lines to be refreshed. An output of the voltage comparator 21 is latched by a relevant one of the latch circuits 23. In the present exemplary embodiment, though not limiting the present invention, the go-around time of switching operations of the first and second switches 25 and 26 is given by (time of go-around by a preset number of times of the refresh operation of the word lines to be refreshed)×(number of the latch circuits).

The encoder 19 receives outputs of the latch circuits 23 in parallel and encodes the so received outputs, as previously mentioned. The encoder then outputs the encoded results. In the temperature measurement circuit 18, the voltage comparator 21 is time-divisionally shared by a plurality of reference voltages associated with a plurality of reference temperatures, and detected results are held by the latch circuits associated with the relevant reference temperatures. The encoder 19 generates encoded signals from the so retained results, and the so generated encoded signals are output to outside the chip. At this time, the results of comparison at higher reference temperatures are prioritized, that is, "1"s are placed on the side of MSB (most significant bit).

The offset control circuit 27 adjusts the divided voltages of the resistor string, not shown, in the sensor unit 20, to control an offset of the voltage comparator 21, such as its input offset voltage. A plurality of terminals of the first switch 25 are connected to respective different taps of the resistor string, not shown, provided within the sensor unit 20. An offset resistance is or is not connected by a command signal of the offset control circuit 27. The offset resistance is implemented by a resistance value common to the respective terminals of the first switch 25. This compensates for the offset in the voltage comparator 21. The value of this offset may be expressed by an offset voltage (of the order of 10 mV) of the voltage comparator 21, including e.g., a current mirror (not shown), with respect to a temperature characteristic value (temperature coefficient) of a junction voltage of a diode as a temperature sensor element (−2 mV/° C.). Hence, the detected result has a temperature accuracy (or variation) of the order of 5° C. The positions of the taps that take out the reference voltages for comparison by the comparator are thus trimmed to improve temperature detection accuracy. Since the single voltage comparator 21 is used in the present application, trimming for a plurality of offsets is unnecessary.

Figure 3:
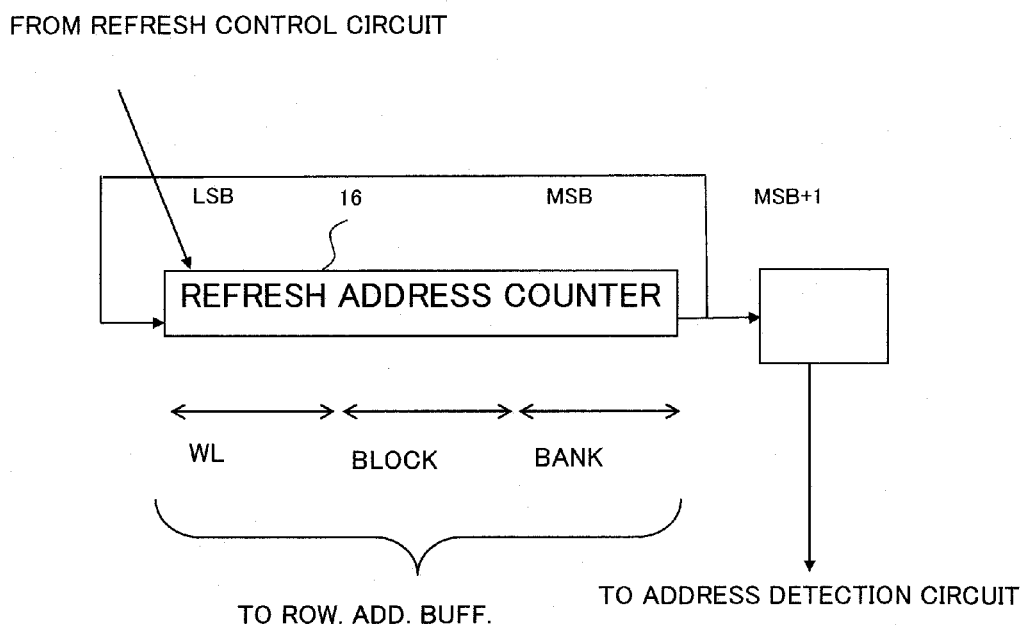
FIG. 3 is a schematic view showing the configuration of a refresh address counter according to the exemplary embodiment of the present invention.

FIG. 3 schematically shows a connection configuration of the refresh address counter 16 and the address detection circuit 17 of FIG. 1. Referring to FIG. 3, a count value of the refresh address counter 16 includes a bit (MSB+1), which is higher by one bit than its most significant bit (MSB), as an overflow flag. A refresh address (row address), which is a count output of the refresh address counter 16, includes a bank selection signal, a block selection signal and a word line selection signal towards a low bit side from the MSB side bit field. However this does not limit the present invention.

When the refresh address counter 16 counts up from 0, for example, until the output is all "1"s, the MSB+1 becomes equal to 1, by a refresh command entered from the refresh command input, to advise the address detection circuit 17 of the fact of end of circulation of the count operation. If the MSB+1 becomes equal to 1, the refresh address counter 16 is automatically cleared, while the MSB+1 is also cleared to zero. Although the address detection circuit 17 is advised of the fact of go-around by the signal of the further upper bit MSB+1 appended to the MSB of the refresh address counter 16, this is merely illustrative and is not intended to restrict the present invention. For example, the address detection circuit 17 may be advised of the address detection based on change of at least one arbitrary bit or of a change in a preset address of the refresh address counter 16.

For example, if a plurality of banks is processed or activated simultaneously by a single refresh operation, a further upper bit of the block address (lower bit of the bank address) is entered to the address detection circuit 17. In case the refresh address counter is of the count-down system, LSB-1 is entered to the address detection circuit 17.

Figure 4:
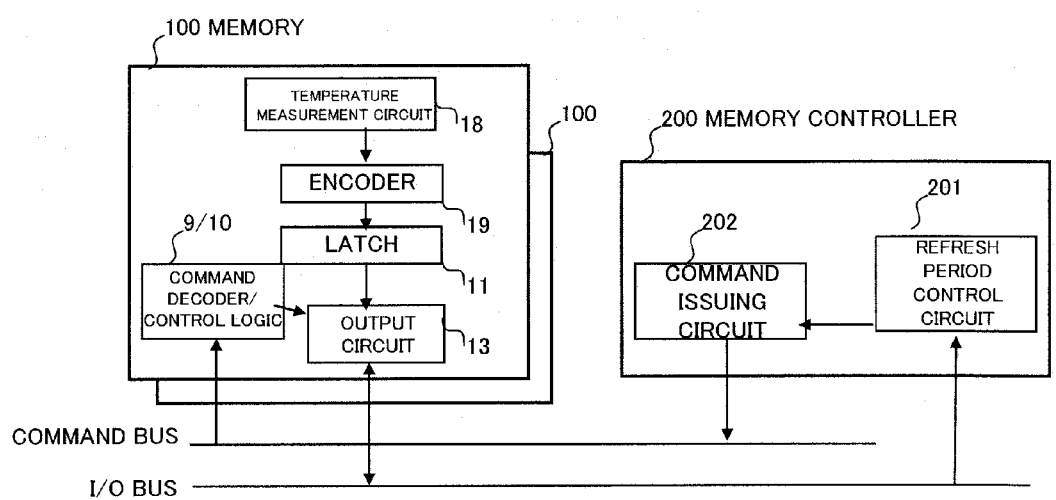
FIG. 4 is a block diagram showing an example configuration of a memory system according to the exemplary embodiment of the present invention.

FIG. 4 is a block diagram showing the connection and essential portions of the internal construction of a memory device and a memory controller (memory system) of the present exemplary embodiment. Referring to FIG. 4, a plurality of memory devices (memories) 100 connected to the command bus and the I/O bus are each constructed as shown in FIG. 1. It is to be noted that, although FIG. 4 shows two memories 100, the number of the memories 100 is not limited to two.

FIG. 4 shows, in each memory 100, a command decoder/control logic 9/10, a temperature measurement circuit 18, an encoder 19, a latch 11 and an output circuit 13. The command decoder/control logic 9/10, temperature measurement circuit 18, encoder 19, latch circuit 11 and the output circuit 13 correspond to the command decoder 9, control logic 10, temperature measurement circuit 18, encoder 19, latch circuit 11 and the output circuit of the input/output buffer 13 of FIG. 1, respectively.

The memory controller 200 includes a refresh period control circuit 201 and a command issuing circuit 202. The command issuing circuit 202 of the memory controller 200 is connected to a command decoder 9 of the memory 100 over a command bus. The refresh period control circuit 201 of the memory controller 200 receives the encoded result of an output circuit 13 of the memory 100 to control the period of issuance of the refresh command from the command issuing circuit 202. The command issuing circuit 202 of the memory controller 200 issues a self-refresh command (SRF command). The command issuing circuit 202 of the memory controller 200 also issues an auto-refresh command (ARF command) to the memory 100 at a preset time interval.

For each refresh operation, the memory 100 changes the refresh address (counts up) and performs a refresh operation of a plurality of memory cells connected to a word line corresponding to the refresh address.

In the present exemplary embodiment, the memory controller 200 allows for reading out encoded results of the memory 100 (results of temperature detection), at a preset timing, i.e., at a preset time interval that is not obstructive to communication with other memory or memories, in accordance with a bus protocol. In reading out the result of temperature detection from the memory 100, the command issuing circuit 202 of the memory controller 200 issues a command dedicated for readout of the results of temperature detection. This dedicated command differs from a normal read command for reading out data from a memory cell of the memory 100. In response to the command for readout of the results of temperature detection from the memory controller 200, the memory 100 sends out the encoded signal, latched by the latch circuit 11, via the output circuit 13 to the I/O bus.

The memory controller 200 receives the encoded signal, sent out from the memory 100 to the I/O bus, to correct the period of issuance of the auto-refresh (ARF) command.

The memory controller 200 has the function of receiving encoded signals from the multiple memories 100 connected to the I/O bus, and processing the so received encoded signals.

The function of processing the encoded signal from the memory 100 by the memory controller 200 may be such that (A) a value of correlation is calculated from the encoded signals of the two memories 100, and the refresh operation is performed at an auto-refresh (ARF) period common to the two memories; or (B) an auto-refresh (ARF) period is calculated individually for the encoded signals of the two memories 100. In this case, two of the refresh period control circuits 201 are provided, and are run in operation asynchronously.

The configuration of a temperature measurement circuit in case there are provided four temperature detection threshold values (reference temperatures) in FIG. 2, is shown in FIGS. 5A and 5B. In these figures, the temperature measurement circuit includes a resistor string 30 connected between a reference voltage VREF0 and GND (ground), a constant current source 31, and a diode 32, whose anode is connected to the constant current source 31 and whose cathode is connected to GND. The temperature measurement circuit also includes a first switch 25 whose four terminals a to d may be changed over. The temperature measurement circuit also includes a voltage comparator 21 whose non-inverting input terminal (+) is connected to an output terminal of the first switch 25 and whose inverting input terminal (−) is connected to a junction of an anode of the diode 32 and the constant current source 31. The temperature measurement circuit further includes four latch circuits 23 and a second switch 26 that connects an output of the comparator 21 to one of the four latch circuits 23. A trimming circuit 28 selects the offset resistance of the resistor string 30 based on a command by the offset control circuit (27 of FIG. 2). The sensor unit 20 (FIG. 2) includes the reference voltage (VREF0), resistor string 30, constant current source 31, diode 32 and the trimming circuit 28.

An on/off switch (PMOS transistor) for power saving may be connected between the resistor string 30 and a reference voltage terminal VREF. This on/off switch is controlled from the measurement controller 24 and is rendered electrically conductive only when the voltage comparator 21 is in operation. In similar manner, another on/off switch (PMOS transistor) not shown for power saving may be introduced between the constant current source 31 and the diode 32. This on/off switch (not shown) is controlled from the measurement controller 24 and is rendered electrically conductive only when the voltage comparator 21 is in operation. It is to be noted that, in the present exemplary embodiment, the on/off switch (not shown) is not limited to the PMOS transistor.

If, after the refresh address counter 16 has performed its count operation, and the count operation has come to an end, such that an overflow has occurred, the address detection circuit 17 activates the temperature monitor signal TMON, that is, renders the signal HIGH, for example. Each time the signal TMON goes HIGH, the measurement controller 24 generates a control signal to change over the connection of the first and second switches 25 and 26 so that the reference temperature will be changed in the sequence of 25° C.→85° C.→100° C.→115° C.→25° C.→85° C.→ . . . . That is, the measurement controller 24 generates a control signal that changes over the input terminals of the first switch 25 in the sequence of a→b→c→a→ . . . to change over the taps of the resistor string 30 to change the reference voltage entered to the voltage comparator 21 to change over the connection of the second switch 26 to the relevant latch circuits 23.

Since the temperature coefficient of a junction voltage Vbe of the diode 32 is approximately −2 mV/° C., the anode voltage of the diode 32 becomes lower in the sequence of the reference temperatures of 25° C., 85° C., 100° C. and 115° C. Looking from the side of the VREF, a tap voltage a connected to an input a of the first switch 25 corresponds to 25° C. In similar manner, a tap voltage connected to an input b corresponds to 85° C., a tap voltage connected to an input c corresponds to 100° C. and a tap voltage connected to an input d corresponds to 115° C. The tap voltage of the resistor string 30, the input b of the first switch 25 is connected to, is lower by (85° C.-25° C.)×(−2 mV/° C.)=120 mV than the tap voltage of the resistor string 30, the input a is connected to. The inputs of the first switch 25 are selected in the sequence of a→b→c→d to supply reference voltages to the voltage comparator 21. The second switch 26 is changed over in the sequence of the latch circuit 23 for TW(25° C.)(TW4), latch circuit 23 for TW(85° C.)(TW1), latch circuit 23 for TW(100° C.)(TW3) and the latch circuit 23 for TW(115° C.)(TW5). The latch circuit 23 for TW(25° C.) holds the result of comparison by the voltage comparator 21 of the voltage of the input a of the first switch 25 to the terminal voltage (anode voltage) of the diode 32. The latch circuit 23 for TW(85° C.) holds the result of comparison by the voltage comparator 21 of the voltage of the input b of the first switch 25 to the terminal voltage (anode voltage) of the diode 32. The latch circuit 23 for TW(100° C.) holds the result of comparison by the voltage comparator 21 of the voltage of the input c of the first switch 25 to the terminal voltage (anode voltage) of the diode 32, and the latch circuit 23 for TW(115° C.) holds the result of comparison by the voltage comparator 21 of the voltage of the input d of the first switch 25 to the terminal voltage (anode voltage) of the diode 32.

Referring to FIG. 5B, the following may be asserted:
(1) If the temperature is lower than 25° C. (25° C.>T), the anode voltage of the diode 32 is higher than the voltage of the input a of the first switch 25. At this time, the anode voltage of the diode 32 is higher than the voltages of the inputs b, c and d of the first switch 25. Outputs TW4, TW1, TW3 and TW5 of the latch circuits 23, holding the outputs of the voltage comparator 21 that compares the anode voltage of the diode 32 with the voltages (detection threshold values) of the inputs a to d of the first switch 25, all become LOW.

(2) If the temperature is somewhere between 25° C. and 85° C. (85° C.>T>25° C.), the anode voltage of the diode 32 is lower than the voltage at the input a of the first switch 25 and higher than the voltage at its input b. At this time, the anode voltage of the diode 32 is higher than the voltages at the inputs c and d of the first switch 25. The anode voltage of the diode 32 is lower than the voltage of the input a (detection threshold value) of the first switch 25. The output TW4 of the latch circuit 23 holding the output of the voltage comparator 21 is thus HIGH. The outputs TW1, TW3 and TW5 of the latch circuits 23, holding the outputs of the comparator 21, which compares the anode voltage of the diode 32 with the voltages at the inputs b, c and d of the first switch 25, become LOW.

(3) If the temperature is somewhere between 85° C. and 100° C. (100° C.>T>85° C.), the anode voltage of the diode 32 is lower than the voltages at the inputs a and b of the first switch 25 and higher than the voltages at its inputs c and d. That is, the anode voltage of the diode 32 is lower than the voltages at the inputs a and b of the first switch 25 (detection threshold values). The outputs TW4, TW1 of the latch circuit 23, holding the outputs of the voltage comparator 21, both become HIGH. Since the anode voltage of the diode 32 is higher than the voltages at the inputs c and d of the first switch 25, the outputs TW3, TW5 of the latch circuit 23, holding the outputs of the voltage comparator 21, become LOW.

(4) If the temperature is somewhere between 100° C. and 115° C. (115° C.>T>100° C.), the anode voltage of the diode 32 is lower than the voltages at the inputs a, b and c of the first switch 25 and higher than the voltage at its input d. That is, the anode voltage of the diode 32 is lower than the voltages at the inputs a and b of the first switch 25 (detection threshold values). The outputs TW4, TW1 and TW3 of the latch circuit 23, holding the outputs of the voltage comparator 21, all become HIGH, with the output TW5 becoming LOW.

(5) If the temperature is higher than 115° C. (T>115° C.), the anode voltage of the diode 32 is lower than the voltages at the inputs a to d of the first switch 25. Hence, the outputs TW4, TW1, TW3 and TW5 of the latch circuit, representing the results of comparison by the voltage comparator 21, all become HIGH.

The encoder 19 encodes the outputs of the four latch circuits 23 (4-bit parallel data) to output the result as 3-bit data.

If the terminal voltage of the diode 32 is higher than the voltage at the input a of the first switch, the terminal voltage of the diode 32 is higher than the voltages of any of the inputs b, c and d of the first switch 25. With TW4 LOW, TW1, TW3 and TW5 all become LOW. It is only sufficient that the encoder 19 encodes 16 combinations of the parallel data of four bit, as outputs of the four latch circuits, into the above mentioned five combinations. Thus, the encoder 19 outputs 3-bit parallel data (temperature code OP <2:0>).

Figures 6A, 6B:
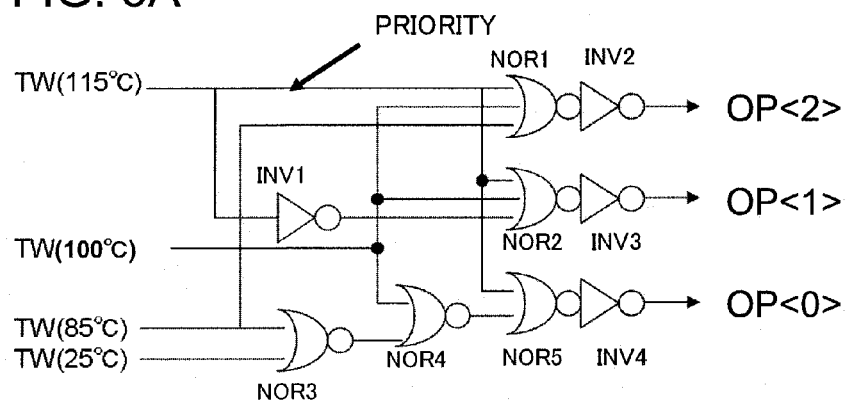
FIG. 6A is a schematic view showing the configuration of an encoder according to the exemplary embodiment of the present invention.
FIG. 6B shows a corresponding truth table.

FIG. 6A schematically shows an example circuit configuration of the encoder 19. FIG. 6B depicts a truth table of the encoder 19. The output TW (115° C.) of the high temperature side latch circuit in the combinations of the values of the four latch circuits 23 is prioritized, and five results of detection are output as three-bit temperature code output OP <2:0>.

This prioritizing processing is performed by reason of temperature measurement carried out once for one of a plurality of different reference temperatures at a preset time interval using a temperature sensor, and by reason of particular refresh period setting for retention of the memory cell information. The reference temperatures are temperature values used as a reference standard for comparison in determining the temperature values. The above temperature measurement and particular refresh period setting are representative of the technical concept of the present invention. That is, in connection with the processing by the encoder, four measurement operations are carried out at preset time intervals. If, in the first measurement for 115° C., the bit (TW5) for the highest temperature is HIGH, the encoder carries out logic processing with priority placed on TW5 to retain the memory cell information no matter which result is output for the second measurement for 100° C., third measurement for 85° and for the fourth measurement for 25'. The corresponding code OP (111) is thus output. On completion of circulation of the four operations, measurement for 115° C. is again carried out by way of a fifth measurement. If the result of the measurement indicates a temperature lower than 115° C., that is, if the bit (TW5) is LOW, the encoder prioritizes the bit (TW3) for a temperature one step lower, that is, 100° C., in its processing for encoding.

Attention ought to be directed to the fact that the bit for TW3 is the result of measurement already executed at the second temperature measurement, and that the result has already been supplied to the relevant latch circuit. If the result of the second temperature measurement TW3 was HIGH, the encoder outputs the corresponding code OP (110) after the fifth measurement and, if the result of the second temperature measurement TW3 was LOW, the result of the third temperature measurement, already executed, is prioritized, and so forth. By so doing, the results of previous temperature measurements may be exploited, depending on the result of an optional measurement temperature, based on the prioritized processing by the encoder, even though different temperature measurements are performed at preset time intervals. Hence, the refresh period is not necessarily unable to be changed unless the go-around through the four temperature measurements ends. Prompt refresh period changes are rendered possible by use of the multiple latch circuits and prioritized encoder processing.

Referring to FIG. 6A, the encoder includes a 3-input NOR circuit NOR1 that receives TW(115° C.), TW(100° C.) and TW(85° C.), and an inverter circuit INV2 that receives an output of the 3-input NOR circuit NOR1. The encoder also includes a 3-input NOR circuit NOR2 that receives TW(115° C.), TW(100° C.) and TW(115° C.) inverted by the inverter circuit INV1, and an inverter INV3 that receives an output of the 3-input NOR circuit NOR2. The encoder also includes a 2-input NOR circuit NOR3 that receives TW(85° C.) and TW(25° C.) and a 2-input NOR circuit NOR4 that receives TW(100° C.) and an output of the NOR circuit NOR3. The encoder also includes a 2-input NOR circuit NOR5 that receives TW(115° C.) and an output of the NOR circuit NOR4 and an inverter INV4 that receives an output of the 2-input NOR circuit NOR5.

With TW(115° C.) HIGH, OP<2:0≥111 (T>115° C.) without dependency upon the values of TW(100° C.), TW(85° C.) and TW(25° C.).

With TW(115° C.) LOW and TW(100° C.) HIGH, OP<2: 0≥110 (115° C.>T>100° C.) without dependency upon the values of TW(85° C.) and TW(25° C.).

With TW(115° C.) and TW(100° C.) LOW and TW(85° C.) HIGH, OP<2:0≥101 (100° C.>T>85° C.) without dependency upon the value of TW(25° C.).

With TW(115° C.), TW(100° C.) and TW(85° C.) LOW and TW(25° C.) HIGH, OP<2:0≥011 (85° C.>T>25° C.).

With TW(115° C.), TW(100° C.), TW(85° C.) and TW(25° C.) LOW, OP<2:0≥010 (25° C.>T).

In the present exemplary embodiment, trimming in the trimming circuit 28 for offset adjustment in the voltage comparator 21 is carried out once at 85° C., for example. If, in the present exemplary embodiment, the tap of the resistor string 30 is selected at 85° C. to cancel out the offset at the voltage comparator 21, the reference voltages for the other reference temperatures (25° C., 100° C. and 115° C.) are selected in unison therewith. The offset control will be described later on with reference to FIG. 10.

<Explanation of Operation>

Figure 7:
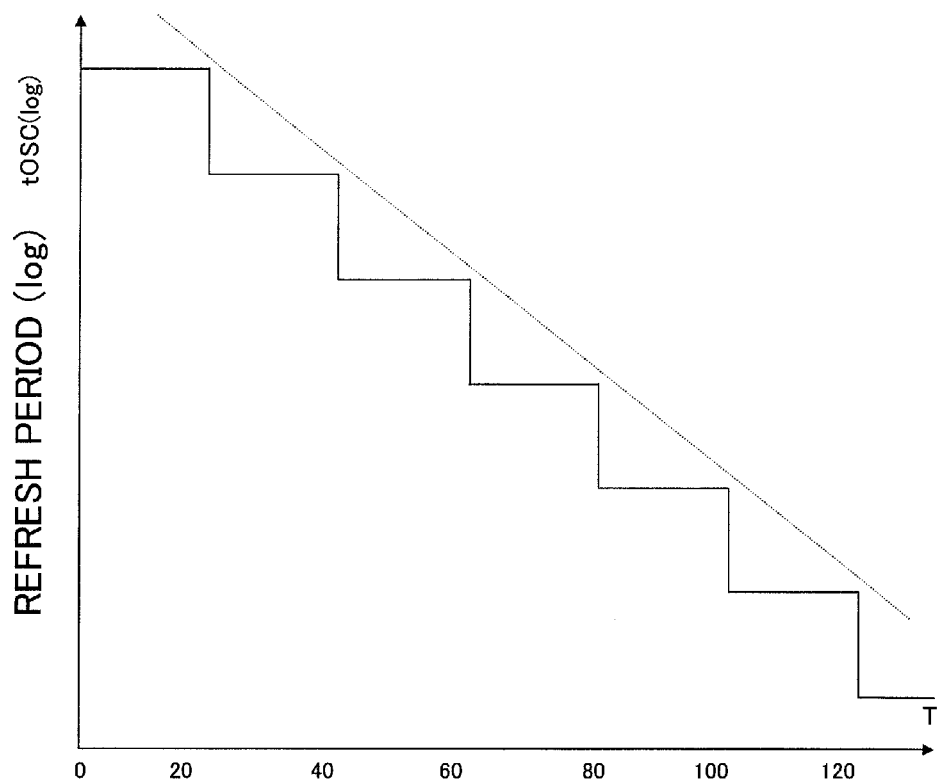
FIG. 7 is a graph for illustrating the operation of controlling the temperature and the refresh period according to the exemplary embodiment of the present invention.

FIG. 7 illustrates the operation of self-refresh control in the present exemplary embodiment. In FIG. 7, a horizontal axis is a temperature and a vertical axis is a refresh period in the time axis expressed with a log scale. In FIG. 7, the refresh period is controlled in seven stages in step of 20° C. The refresh periods are variably set for temperature ranges of Tj>120° C., 120° C.≥Tj>100° C., 100° C.≥Tj>80° C., 80° C.≥Tj>60° C., 60° C.≥Tj>40° C., 40° C.≥Tj>20° C., 20° C.≥Tj>0° C. and Tj≤0° C., where Tj is a detection temperature detected by the diode 32, as a temperature sensor element. Specifically, Tj is a temperature of a silicon substrate which is equal to a junction temperature of an impurity-diffusion layer to which is coupled the amount of the charge representing the information in a memory sell. In the case of the self-refresh, the refresh control circuit 15 causes the refresh period to be changed in accordance with the encoded signal OP, as described above. In the case of the auto-refresh, the refresh period shown indicates the period of ARF (auto-refresh) command issued by the memory controller, as set out above. In FIG. 7, a refresh period on the lower temperature side of a neighboring refresh period is longer by powers of 2 than that of the neighboring refresh period, that is, twice as long as the period in the log scale than the neighboring refresh period. However, the multiplication factor of the refresh period may arbitrarily set at each temperature. It is to be noted that, with the present exemplary embodiment, the multiplication factor of the period is not limited to powers of 2.

Figure 8:
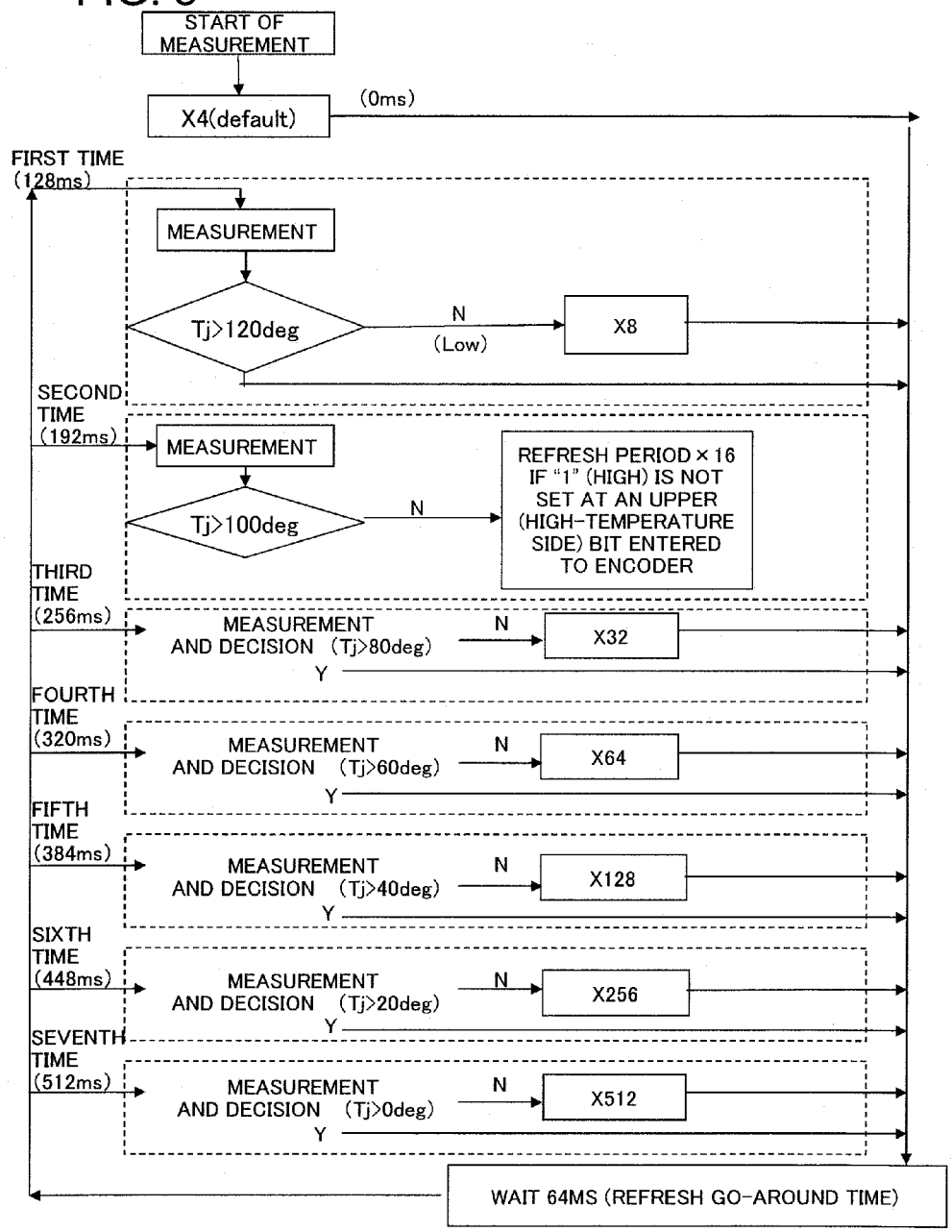
FIG. 8 is a flowchart for illustrating the operation of the exemplary embodiment of the present invention.

FIG. 8 is a flowchart for illustrating the operation of the present exemplary embodiment. Referring to FIG. 8, the flowchart, herein seven temperature measurements (64 ms×seven) in step of 20° C., now described, is initiated after the start of measurement. The operation of temperature measurement is initiated as from the time of power up of the device. A single temperature measurement for a single reference temperature, used as a reference standard for temperature measurement, is carried out at least for each go-around (64 ms) of the refresh operation of a set of word lines to be refreshed. This temperature measurement is carried out in accordance with an auto-refresh command issued by the memory controller, or in accordance with a refresh request issued by a frequency multiplier, not shown, via an internal timer OSC, not shown, after entry to a self-refresh command.

First, the refresh period of the frequency multiplier is set to a value corresponding to the shortest time of the refresh period of the memory cell (x4) as a default value. It is to be noted that the frequency multiplier (now shown) is a circuit loaded on the memory 100 (semiconductor memory device), for use for self-refresh, in case the refresh command is issued by the memory 100. In case the refresh command is issued by the memory controller, the frequency multiplier is a circuit within the refresh period control circuit 201 loaded on the memory controller 200 used for auto-refresh. It is also to be noted that the period of an oscillator itself may be varied in place of using the frequency multiplier. Meanwhile, the above mentioned value (x4) means the shortest refresh period useful in retention of the information stored in memory cells.

In accordance with the temperature measurement, carried out at least for each circulation of the refreshing operation of the set of a plurality of word lines to be refreshed (every 64 ms), and the result of temperature decision, the following sequence of operations is carried out:

(a) If Ti>120° C., with the result of decision being "Y", the refresh period is maintained at the shortest value x4 (multiplication factor of the double period). If Tj<120° C., with the result of decision being "N", the refresh period is changed to twice the shortest value x4 (x8). By so doing, the power consumption necessary for refresh is one-half that for default.

(b) If Tj>100° C., with the result of decision being "Y", the refresh period is maintained at the period of the previous condition (x4 or x8). If Tj<100° C., with the result of decision being "N", and "1" (HIGH) is not set at the upper (high temperature side) bit, entered to the encoder 19, the refresh period is changed to x16.

(c) If Tj>80° C., with the result of decision being "Y", the refresh period is maintained at the period of the previous condition (x4, x8 or x16). If Tj<80° C., with the result of decision being "N", and "1" (HIGH) is not set at upper two (high temperature side) bits, entered to the encoder 19, the refresh period is changed to x32.

(d) If Tj>60° C., with the result of decision being "Y", the refresh period is maintained at the period of the previous condition (x4, x8, x16 or x32). If Tj<60° C., with the result of decision being "N", and "1" (HIGH) is not set at upper three (high temperature side) bits, entered to the encoder 19, the refresh period is changed to x64. (e) If Tj>40° C., with the result of decision being "Y", the refresh period is maintained at the period of the previous condition (x4, x8, x16, x32 or x64). If Tj<40° C., with the result of decision being "N", and "1" (HIGH) is not set at upper (high temperature side) four bits, entered to the encoder 19, the refresh period is changed to x128.

(f) If Tj>20'C, with the result of decision being "Y", the refresh period is maintained at the period of the previous condition (x4, x8, x16, x32, x64 or x128). If Tj<20'C, with the result of decision being "N", and "1" (HIGH) is not set at upper (high temperature side) five bits, entered to the encoder 19, the refresh period is changed to x256.

(g) If Tj>0° C., with the result of decision being "Y", the refresh period is maintained at the period of the previous condition (x4, x8, x16, x32, x64, x128 or x256). If Tj<0° C., with the result of decision being "N", and "1" (HIGH) is not set at upper (high temperature side) six bits, entered to the encoder 19, the refresh period is changed to x512.

Noteworthy is the fact that, in the above setting, Tj is measured with respect to a preset reference temperature and a decision is made once each preset period to carry out the flowchart with respect to the reference temperature. A sequence of temperature measurement operations corresponding to seven times each of 64 ms is repeated.

The reference temperature for the above measurement that is used first is the high side temperature. For example, the value (x4), corresponding to the shortest refresh period, is set at a default value. After a wait (WAIT) time of 64 ms, which is the go-around time of the refresh operations for at least a set of the multiple word lines to be refreshed, the processing is repeated, beginning from the processing for decision for Ti>120° C., with the multiplication factor x4 as a default. The temperature decision at each reference temperature of FIG. 8 may be "less than (>)", its reverse "not less than", "less than or equal to (≥)" or its reverse "more than or equal t" or "more than". The weight time of 64 ms may also be 128 ms, which is twice that for the preset number of times of the refresh operations. In the case of the self-refresh, the internal timer, owned by the memory device, is desirably a current-controlled oscillator (OSC) 44 not exhibiting temperature dependency. The same may be the of an internal timer loaded on the memory controller.

With the present exemplary embodiment, taking into consideration the fact that the information retention characteristic on the high temperature side represents the worst condition, as characteristic of the information retention property of the memory cell, the temperature is sequentially measured from the high temperature side to give a decision. By so doing, the self-refresh operation may be carried out, that is, the information retention property may be assured, even during the temperature decision operation. The reason is that the refresh period setting values (x4, . . . , x512) are smaller, and the refresh periods are shorter, on the high temperature side than those on the low temperature side. For example, in the first measurement, the temperature is measured with respect to the reference temperature of 120° C., and a decision on the temperature is given. The measured result is stored in the first one of the latch circuits 23 (result information of 1 or 0).

In the second measurement, the temperature is measured with respect to the reference temperature of 100° C., and decision is made on the temperature. The measured result is stored in the second one of the latch circuits 23. If, at this time, the measured result is not higher than 100° C., and the information of the first latch information is LOW, with the result of decision being for 120° C. or less, the encoded result accompanying the output of the latch circuits 23 (total of the latch circuits), that is, the encoder output OP, is changed from x8 to x16. Thus, the refresh period is controlled to be longer, that is, the refresh frequency is controlled to be lower. If the measured result is higher than 100° C., the encoded result for the first measurement is maintained, that is, the refresh period (period corresponding to x4 or x8) is not changed. That is, the refresh frequency is maintained. The refresh period for the memory cell may be designed in safety in a direction of not destructing the information retained in the memory cell.

In the present exemplary embodiment, the time interval between temperature measurements/decisions is a WAIT time. During the WAIT time, it is possible to exercise control to suppress current consumption of the temperature sensor, such as control for halting the current in the resistor string 30, in the voltage comparator 21 or in the resistor 33. The WAIT time corresponds to the time of one, ten or one hundred go-around events of the refresh operations, and is not limited to 64 ms. The WAIT time depends on temperature changes during self-refresh and may, for example, be on the order of 10 sec unless the device temperature (=junction temperature Tj) is changed significantly. The WAIT time of the order of 10 sec corresponds to temperature measurement once for 156 refresh go-around events. It should be noted that the WAIT time is preferably selected to be equal to multiple number, e.g., 0.5, 1.0 or 2.0, times the go-around time of the count operation of the refresh address counter which is performed for a plurality of word lines to be refreshed as a unit. If the multiple used is 2.0, a further upper bit of the MSB of the refresh address counter may be used. If the memory is of two banks, each of which is to be refreshed simultaneously, the multiple is set to 0.5. In this case, the MSB-1 bit of the refresh address counter may be used.

The offset control circuit 27, referred to in connection with FIG. 2, and the trimming circuit 28, referred to in connection with FIG. 5, are now explained.

Figure 9:
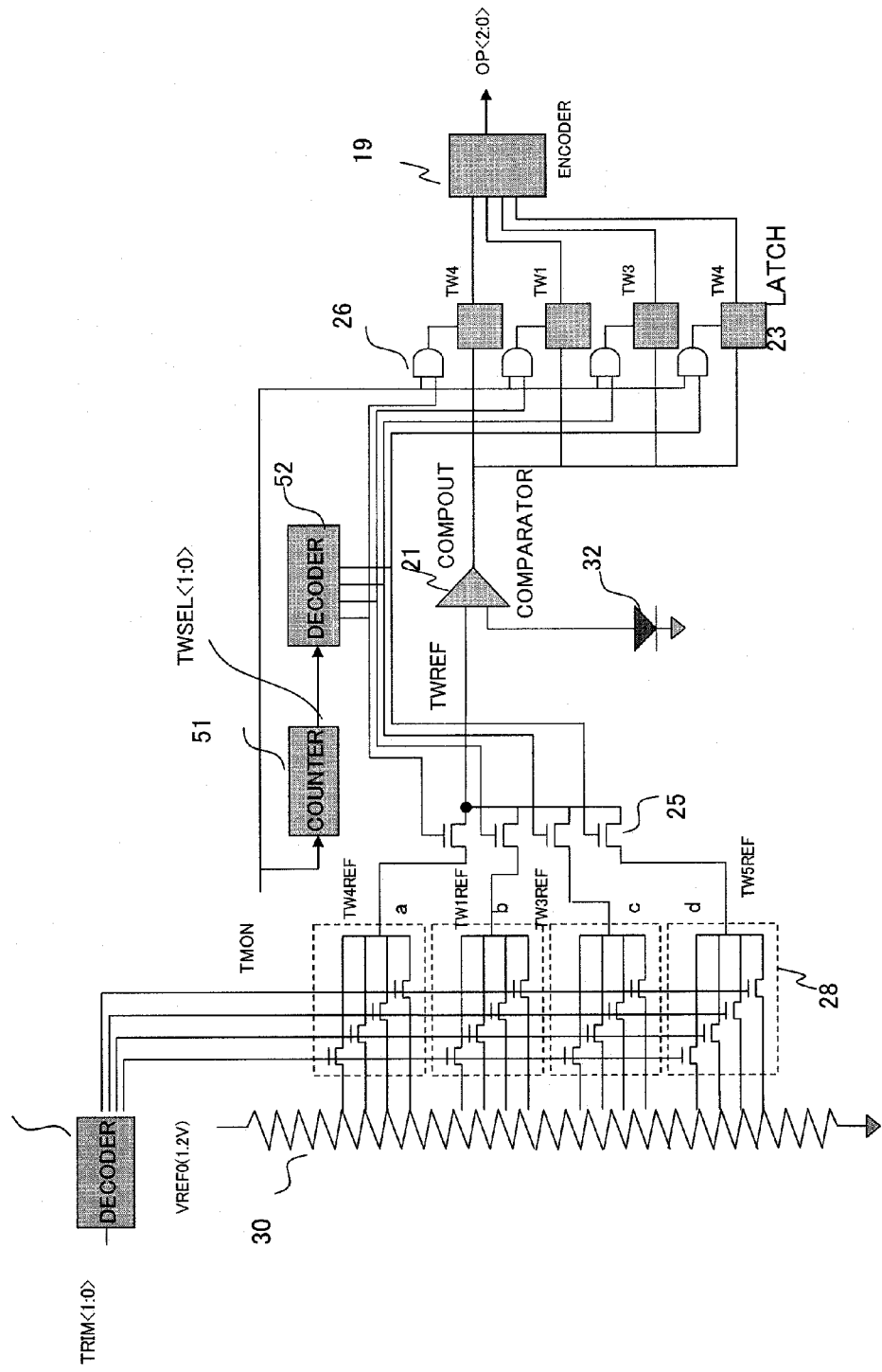
FIG. 9 is a schematic view showing a temperature measurement circuit according to another exemplary embodiment of the present invention.

FIG. 9 shows an example configuration of the temperature measurement circuit 18 of FIG. 5 and illustrates the relationship between the trimming circuit 28 used for exercising offset control and the first switch 25. In FIG. 9, the counter 51 and the decoder 52 form the measurement controller 24 of FIG. 5. The signal TMON, supplied to the counter 1, is output from the address detection circuit 17 of FIG. 5 at a time point the circuit has detected the end of circulation of the refresh addresses. In response to the signal TMON, the counter 51 performs its count operation. The decoder 52 decodes count output of the counter 51 to output a 4-bit signal. The first switch 25 includes four NMOS transistors (pass transistors) whose gates receive the four bit signals from the decoder 52. These four NMOS transistors have one ends (sources or drains) connected common to transmit the voltage at the other end of the NMOS transistor in an on-state to the voltage comparator 21 as a reference voltage TWREF. The voltage comparator 21 compares the terminal voltage at the diode 32 with the reference voltage TWREF to supply a result of comparison COMPOUT via the second switch 26 to a relevant one of the latch circuits 23.

In the configuration of FIG. 9, the second switch 26 includes four AND circuits that take a logical product of the signal (4-bit signal) from the decoder 52 and the signal TMON. On receipt of a HIGH pulse of the signal TMON, the latch circuit 23 that receives a value HIGH of the decoded signal from the decoder 52 latches the output COMPOUT of the voltage comparator 21. The encoder 19 encodes outputs TW4, TW1, TW3 and TW5 of the latch circuits 23 to output a 3-bit encoded signal OP <2:0>, in the same way as in the configuration of FIGS. 5A and 5B.

The trimming circuit 28 (offset correction selectors) includes four NMOS pass transistors, each having one out of the source and the drain connected to four neighboring taps of the resistor string 30 and having the other of the source and the drain connected common to the first switch 25. The gates of the four NMOS pass transistors receive outputs of the decoder 53. Specifically, the trimming circuit includes the offset correction selector including four NMOS pass transistors for TW4REF (25° C.), the offset correction selector including four NMOS pass transistors for TW1REF (85° C.), the offset correction selector including four NMOS pass transistors for TW3REF (100° C.) and the offset correction selector including four NMOS pass transistors for TW5REF (115° C.). The one NMOS transistors out of the four NMOS transistors of the respective offset correction selectors are turned on in common by common decoder outputs.

The decoder 53 receives a 2-bit signal TRIM <1:0>. A 4-bit signal, decoded from the 2-bit signal, is supplied to the gates of the four NMOS pass transistors that constitute the offset correction selectors. These NMOS pass transistors are relevant to the reference voltages TW4REF, TW1REF, TW3REF and TW5REF. Depending on outputs of the decoder 53, i'th NMOS pass transistors, where 1≤i≤4, of the relevant offset correction selectors for the reference voltages TW4REF, TW1REF, TW3REF and TW5REF, are turned on in common. Offset control in the trimming circuit (offset correction selectors) 28 is carried out once at e.g., 85° C., out of 115° C., 100° C., 85° C. and 25° C.

Figure 10:
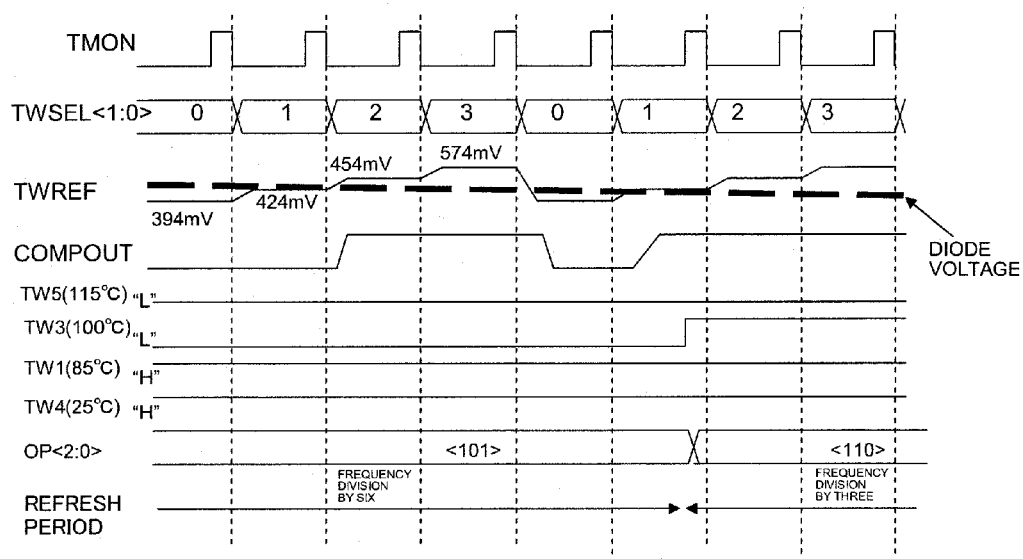
FIG. 10 is a timing diagram for illustrating the trimming operation of the Example of FIG. 9.

FIG. 10 is a timing diagram for illustrating the operation of the circuit shown in FIG. 9. Meanwhile, the 2-bit TWSEL<1:0> of FIG. 10 is a count output of the counter 51 of FIG. 9. In response to the signal TMON from the address detection circuit (17 of FIG. 5), the counter 51 performs the count operation of 0, 1, 2, 3, 0, 1, . . . .

In response to an output of the decoder 52, decoding the count output (2 bits) of the counter 51, the first switch 25 sequentially changes over the voltage TW5REF of 394 mV at the terminal d for 115° C., the voltage TW3REF of 424 mV at the terminal c for 100° C., the voltage TW1REF of 454 mV at the terminal b for 85° C. and the voltage TW4REF of 574 mV at the terminal a for 25° C., in this order, to supply the resulting voltage as the reference voltage TWREF to be supplied to the voltage comparator 21.

The voltage comparator 21 compares the terminal voltage of the diode 32, indicated by broken lines at the column of the reference voltage TWREF, with the reference voltage TWREF. In the instance shown in FIG. 10, the output COMPOUT for the result of comparison by the voltage comparator 21 are LOW, LOW, HIGH and HIGH, in this order during the four cycles corresponding to the count outputs (2 bits) of the counter 51 of 0, 1, 2 and 3. The output COMPOUT from the voltage comparator 21 is sequentially held in the four latch circuits 23 in synchronization with the rise of TMON, for example, with the 3-bit output OP <2:0> of the encoder 19 being <101>. At this time, the self-refresh period is sextupled (with the frequency being one-sixth). The output COMPOUT for the result of comparison by the voltage comparator 21 are then LOW, HIGH, HIGH and HIGH in this order during the next four cycles of 0, 1, 2 and 3 corresponding to the count outputs (2 bits) of the counter 51. The output COMPOUT from the voltage comparator 21 is held in synchronization with the rise of TMON, for example, with the 3-bit output OP <2:0> of the encoder 19 being <110>. At this time, the self-refresh period is tripled (with the frequency being one-third). Meanwhile, in FIG. 10, the encoded signal OP <2:0> of the encoder 19 is output during the operating cycle of the voltage comparator 21, for simplicity in the explanation. Alternatively, the processing for encoding by the encoder 19 may be initiated at the cycle next following the cycle when the counter 51 has counted from 0 to 3.

The temperature coefficient of the junction voltage of the diode 32 is −2 mV/° C., as mentioned above. The offset voltage of the voltage comparator 21 is usually on the order of 10 mV. Hence, there is generated a variation on the order of 5° C. in the result of temperature detection. To improve accuracy in temperature detection, it is necessary to perform trimming of the tap positions from which the reference voltage for comparison by the voltage comparator are taken out. For example, if an N-number of separate voltage comparators is used to find an N-number of stages of the detection level, it is necessary to perform an N-number of times of trimming, as a result of which the test time is prolonged. If the number of the voltage comparators is increased to increase the number of reference voltages (detection threshold values), the circuit area is increased. The present exemplary embodiment overcomes these problems. Of course, the above described exemplary embodiments 1 and 2 may be combined together.

The disclosures of the above Patent Documents are incorporated by reference herein. The exemplary embodiments may be changed or adjusted within the framework of the entire disclosure, inclusive of claims, and on the basis of the basic technical concept of the present invention.

The above Examples are related with a semiconductor memory device. However, it is to be noted that the basic technical concept of the present invention is applicable to semiconductor devices in general and is not restricted to the semiconductor memory device. There is no limitation to the forms or structures of the refresh address counter 16 or the address detection circuit 17 that may be used. It is sufficient that the transistors used are FETs (Field-Effect Transistors), and a variety of FETs, such as MIS (Metal Oxide Semiconductor), may be used in place of the MOS (Metal Oxide Semiconductor). Bipolar transistors may also be used.

In addition, NMOS transistors (N-channel MOS transistors) are typical of the transistors of the first conductivity type, while PMOS transistors (P-channel MOS transistors) are typical of the transistors of the second conductivity type. The present application is useful not only for volatile memories but also for non-volatile memories in which the information retention characteristic is dependent on the temperature. It is to be noted that the present application is not limited to an MCU or a logic device containing memory cells, and is useful not only for memory systems but also for semiconductor systems in general. A large variety of combinations or selection of elements disclosed herein may be made within the framework of the claims. That is, the present invention may encompass various modifications or corrections that may occur to those skilled in the art in accordance with and within the gamut of the entire disclosure of the present invention, inclusive of claim and the technical concept of the present invention.

What is claimed is:

1. A dynamic random access memory comprising:
a memory cell array;
a temperature measurement circuit providing a first temperature measurement output having a first level to indicate a temperature lower than a first predetermined temperature and a second level to indicate a temperature higher than the first predetermined temperature, the temperature measurement circuit comprising;
a temperature sensor device;
a resistor string having a plurality of taps;
a first trimming circuit having a first plurality of transistors connected to the plurality of taps, wherein each of the first plurality of transistors is connected to a respective one of the plurality of taps of the resistor string;
a first latch circuit for providing the first temperature measurement output; and
a self-refresh control circuit refreshing the memory cell array with a first refresh frequency while the first temperature measurement output has the first level and refreshing the memory cell array with a second refresh frequency higher than the first refresh frequency while the first temperature measurement output has the second level, wherein the first plurality of transistors are controlled to improve the accuracy of the first temperature measurement output.

2. The dynamic random access memory as claimed in claim 1, wherein the temperature measurement circuit further comprises a reference voltage generator connected to the resistor string.

3. The dynamic random access memory as claimed in claim 2, wherein the resistor string is connected to the reference voltage generator through a transistor.

4. The dynamic random access memory as claimed in claim 1, wherein the temperature sensor device is a diode.

5. The dynamic random access memory as claimed in claim 1, wherein the temperature measurement circuit further comprises a comparator having a first input connected to the resistor string.

6. The dynamic random access memory as claimed in claim 5, wherein the first input of the comparator is connected to the resistor string through a transistor.

7. The dynamic random access memory as claimed in claim 5, wherein the comparator has a second input connected to the temperature sensor device.

8. The dynamic random access memory as claimed in claim 5, wherein the first plurality of transistors are controlled to compensate for an offset of the comparator.

9. The dynamic random access memory as claimed in claim 5, wherein the first trimming circuit is coupled between the resistor string and the comparator.

10. The dynamic random access memory as claimed in claim 1, wherein the first level and the second level of the first temperature measurement output are a low level and a high level, respectively.

11. The dynamic random access memory as claimed in claim 1, wherein each of the first plurality of transistors has one end connected to one of the plurality of taps and the other end connected to a common node.

12. The dynamic random access memory as claimed in claim 11, wherein one of the first plurality of transistors is turned on and other transistors of the first plurality of transistors are turned off.

13. The dynamic random access memory as claimed in claim 1, wherein the temperature measurement circuit provides a second temperature measurement output having a first level to indicate a temperature lower than a second predetermined temperature higher than the first predetermined temperature, and a second level to indicate a temperature higher than the second predetermined temperature, the temperature measurement circuit further comprising;
- a second trimming circuit having a second plurality of transistors connected to the plurality of taps; and
- a second latch circuit for providing the second temperature measurement output;
- wherein the self-refresh control circuit refreshes the memory cell array with a third refresh frequency higher than the second refresh frequency while the second temperature measurement output has the second level and the second plurality of transistors are controlled to improve the accuracy of the second temperature measurement output.

14. The dynamic random access memory as claimed in claim 13, wherein the temperature measurement sequentially latches the first and second temperature measurement outputs.

15. The dynamic random access memory as claimed in claim 1, further comprising an output circuit configured to output the first temperature measurement output in response to a temperature read command received by a command decoder.

16. The dynamic random access memory as claimed in claim 15, wherein the latency between receiving the temperature read command and outputting the first temperature measurement output is substantially the same as the latency between receiving a memory cell array read command and outputting data from the memory cell array.

17. A dynamic random access memory comprising:
- a memory cell array;
- a temperature measurement circuit providing a first temperature measurement output having a first level to indicate a temperature lower than a first predetermined temperature and a second level to indicate a temperature higher than the first predetermined temperature, the temperature measurement circuit comprising;
- a temperature sensor device;
- a resistor string having a plurality of taps;
- a first trimming circuit having a first plurality of transistors connected to the plurality of taps;
- a first latch circuit for providing the first temperature measurement output; and
- a self-refresh control circuit refreshing the memory cell array with a first refresh frequency while the first temperature measurement output has the first level and refreshing the memory cell array with a second refresh frequency higher than the first refresh frequency while the first temperature measurement output has the second level, wherein the first plurality of transistors are controlled to improve the accuracy of the first temperature measurement output;
- wherein the temperature measurement circuit further comprises a comparator having a first input connected to the resistor string and the first trimming circuit is coupled between the resistor string and the comparator.

* * * * *